United States Patent
Kim et al.

(10) Patent No.: US 12,457,791 B2
(45) Date of Patent: Oct. 28, 2025

(54) METHOD OF FORMING CONTACT STRUCTURE, METHOD OF FABRICATING SEMICONDUCTOR DEVICE, CONTACT STRUCTURE AND SEMICONDUCTOR DEVICE INCLUDING THE SAME

(71) Applicants: SK hynix Inc., Icheon (KR); Chungbuk National University Industry-Academic Cooperation Foundation, Cheongju (KR); Korea University Research and Business Foundation, Sejong Campus, Sejong (KR); KOREA INSTITUTE OF ENERGY RESEARCH, Daejeon (KR)

(72) Inventors: Ka-Hyun Kim, Cheongju (KR); Hyun Seok Lee, Daejeon (KR); Jae Woo Lee, Sejong (KR); Joon-Ho Oh, Busan (KR)

(73) Assignees: SK hynix Inc., Icheon (KR); Chungbuk National University Industry-Academic Cooperation Foundation, Cheongju (KR); Korea University Research and Business Foundation, Sejong Campus, Sejong (KR); Korea Institute of Energy Research, Daejeon (KR)

( * ) Notice: Subject to any disclaimer, the term of this patent is extended or adjusted under 35 U.S.C. 154(b) by 498 days.

(21) Appl. No.: 18/148,815

(22) Filed: Dec. 30, 2022

(65) Prior Publication Data
US 2023/0231027 A1    Jul. 20, 2023

(30) Foreign Application Priority Data

Jan. 18, 2022 (KR) .................. 10-2022-0007467

(51) Int. Cl.
*H10D 64/62* (2025.01)
*H01L 21/285* (2006.01)
(Continued)

(52) U.S. Cl.
CPC ....... *H10D 64/62* (2025.01); *H01L 21/28518* (2013.01)

(58) Field of Classification Search
CPC ......... H01L 21/28525; H01L 21/28518; H01L 21/76897; H10D 64/62; H10D 64/251
See application file for complete search history.

(56) References Cited

U.S. PATENT DOCUMENTS

2007/0010051 A1* 1/2007 Wu ............... H10D 62/021
257/E21.205
2007/0254464 A1 11/2007 Greene et al.
(Continued)

FOREIGN PATENT DOCUMENTS

KR     10-0236100 B1     12/1999
KR     1020050035981 A     4/2005

*Primary Examiner* — Mohsen Ahmadi

(57) ABSTRACT

Disclosed are a method of forming a contact structure, a method of fabricating a semiconductor device, a contact structure, and a semiconductor device including the same. A method of forming a contact structure may comprise forming a porous silicon layer on a substrate by using an epitaxy process, forming a dielectric layer on the porous silicon layer, forming a metal layer on the dielectric layer, forming a silicide member having a three-dimensional structure in the porous silicon layer by diffusing metal atoms of the metal layer into the porous silicon layer through the dielectric layer and reacting the diffused metal atoms with the porous silicon layer in a heat treatment process, removing the metal layer and the dielectric layer, and forming a conductive layer in contact with the silicide member.

19 Claims, 10 Drawing Sheets

(51) Int. Cl.
*H01L 21/768* (2006.01)
*H10D 62/83* (2025.01)
*H10D 64/23* (2025.01)

(56) References Cited

U.S. PATENT DOCUMENTS

| | | | |
|---|---|---|---|
| 2008/0093631 A1* | 4/2008 | Chi | H10D 62/83 257/192 |
| 2012/0104498 A1* | 5/2012 | Majumdar | H10D 30/6744 438/154 |
| 2014/0335918 A1* | 11/2014 | Gardner | H01G 11/02 29/623.5 |
| 2016/0005824 A1* | 1/2016 | Lin | H01L 21/28518 438/654 |
| 2020/0098572 A1* | 3/2020 | Wang | H01L 21/28562 |
| 2021/0118994 A1* | 4/2021 | Tsai | H10D 30/6219 |
| 2021/0366907 A1* | 11/2021 | Liao | H10D 84/038 |
| 2023/0326849 A1* | 10/2023 | Wu | H01L 21/76897 257/774 |

\* cited by examiner

< Heat treatment >

METHOD OF FORMING CONTACT STRUCTURE, METHOD OF FABRICATING SEMICONDUCTOR DEVICE, CONTACT STRUCTURE AND SEMICONDUCTOR DEVICE INCLUDING THE SAME

CROSS-REFERENCE TO RELATED APPLICATION

The present application claims, under 35 U.S.C. § 119(a), the benefit of Korean application No. 10-2022-0007467, filed on Jan. 18, 2022, which is herein incorporated by reference in its entirety.

BACKGROUND

1. Field

The present disclosure relates to an inter-material junction structure, a device including the same, and fabricating methods thereof, and more particularly, to a method of forming a contact structure, a method of fabricating a semiconductor device including forming the contact structure, a contact structure, and a semiconductor device including the contact structure.

2. Description of the Related Art

In response to the trend that the design rules are decreasing and the degree of integration of semiconductor devices is increasing, improvement related to structural stability and electrical characteristics of semiconductor devices is desirable. In particular, as device miniaturization progresses, the electrical resistance of the circuit pattern in the device may be relatively significantly affected by the contact resistance occurring in the junction region of different materials rather than the resistance of the conductive line made of a single material. Accordingly, a technique for reducing the contact resistance is desirable. For example, a technique for forming a silicide therebetween has been proposed in order to reduce the contact resistance between a semiconductor material and a metal.

However, as the degree of integration of the semiconductor device is increased and the size of the device is reduced, the conventional method has reached a limit in reducing the contact resistance. Therefore, a new technology capable of overcoming the limitations and problems of the conventional method and further reducing the contact resistance of the semiconductor device may be desirable.

SUMMARY

An object of embodiments of the present disclosure is to provide a method of forming a contact structure capable of overcoming the limitations and problems of the conventional method and reducing the contact resistance of a semiconductor device, and a method of fabricating a semiconductor device using the same.

Further, another object of the present invention is to provide a contact structure capable of securing low contact resistance and excellent contact characteristics even in a small area, and a semiconductor device including the same.

The object to be solved by embodiments of the present disclosure is not limited to the above-mentioned objects, and other objects will be understood by those skilled in the art from the following description.

According to an embodiment of the present disclosure, a method of forming a contact structure includes: forming a porous silicon layer on a substrate by using an epitaxy process; forming a dielectric layer on the porous silicon layer; forming a metal layer on the dielectric layer; forming a silicide member having a three-dimensional structure in the porous silicon layer by diffusing metal atoms of the metal layer into the porous silicon layer through the dielectric layer and reacting the diffused metal atoms with the porous silicon layer in a heat treatment process; removing the metal layer and the dielectric layer; and forming a conductive layer in contact with the silicide member.

The porous silicon layer may have a porosity of about 10 to about 30 vol %.

The porous silicon layer may be formed by a plasma enhanced chemical vapor deposition (PECVD) method at a process temperature of room temperature to about 300° C.

The dielectric layer may have a porosity of less than about 20 vol %, or preferably less than 5 vol %.

The dielectric layer may have a thickness of about 0.1 nm to about 200 nm.

The dielectric layer may include one or more of silicon oxide, silicon nitride, silicon oxynitride, aluminum oxide, hafnium oxide, and zirconium oxide.

The metal layer may include one or more of tungsten (W), titanium (Ti), tantalum (Ta), platinum (Pt), nickel (Ni), cobalt (Co), and molybdenum (Mo).

The heat treatment process may be performed at a temperature of about 300° C. to about 950° C.

The silicide member may have a dendrite structure.

The method may further include etching at least a portion of the porous silicon layer to at least partially expose the three-dimensional structure of the silicide member after removing the metal layer and the dielectric layer, and the conductive layer may be formed to three-dimensionally contact the three-dimensional structure of the exposed silicide member.

Forming the porous silicon layer may include: forming a mask layer having an opening on the substrate, the opening exposing a first region of the substrate; forming a silicon material layer on the first region and the mask layer, wherein the silicon material layer includes a first silicon layer formed on the first region and a second silicon layer formed on the mask layer, and wherein the first silicon layer has a crystalline structure and the second silicon layer has an amorphous structure; and removing the second silicon layer. The first silicon layer formed on the first region may correspond to the porous silicon layer.

The first region of the substrate may have a crystal plane in a (100) direction.

The mask layer may be an insulating layer.

The second silicon layer may be removed by, for example, an etching process using hydrogen plasma.

According to another embodiment of the present disclosure, in the method of fabricating a semiconductor device including a contact structure, a method of fabricating a semiconductor device may include forming the contact structure by using the above-described method.

According to another embodiment of the present disclosure, a contact structure of a semiconductor device includes a substrate; a silicide member disposed on the substrate and having a three-dimensional structure; and a conductive layer disposed on the substrate to be in contact with the silicide member and disposed to three-dimensionally contact the three-dimensional structure of the silicide member by embedding at least a portion of the silicide member therein.

The silicide member may have a dendrite structure.

The contact structure may further include a porous silicon layer which is disposed between the substrate and the conductive layer, and has an epitaxial structure. A lower portion of the silicide member may be embedded in the porous silicon layer, and an upper portion of the silicide member may be embedded in the conductive layer.

The porous silicon layer may have a porosity of about 10 to about 30 vol %.

An upper surface of the substrate may have a crystal plane in a (100) direction.

According to another embodiment of the present disclosure, a semiconductor device includes a contact structure, wherein the contact structure includes the above-described characteristics.

According to embodiments of the present disclosure, it is possible to implement a method of forming a contact structure capable of overcoming the limitations and issues of the conventional method and reducing the contact resistance of a semiconductor device and a method of fabricating a semiconductor device using the same. Furthermore, according to embodiments of the present disclosure, a contact structure capable of securing low contact resistance and excellent contact characteristics even in a small area and a semiconductor device including the same may be implemented.

In particular, according to embodiments of the present disclosure, contact resistance may be greatly reduced and contact characteristics may be greatly improved through three-dimensional contact between a semiconductor and a conductor (e.g., metallic conductor). Furthermore, according to embodiments of the present disclosure, since a contact formation region may be easily defined by using a self-aligning technique, fabricating a semiconductor device may be facilitated. Embodiments of the present disclosure may be usefully applied to high-integration and high-performance semiconductor devices.

DETAILED DESCRIPTION

Figure 1A:
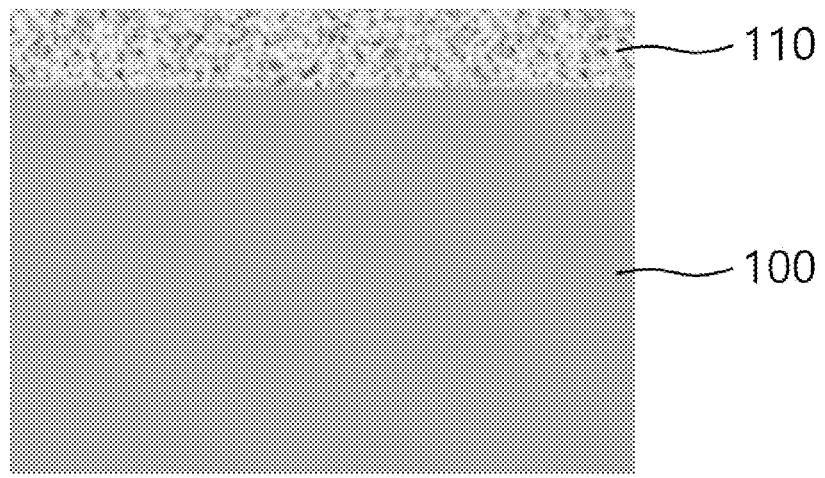
FIGS. 1A, 1B, 1C, 1D, 1E, 1F, and 1G are cross-sectional diagrams illustrating a method of forming a contact structure according to an embodiment of the present disclosure.

Hereinafter, embodiments of the present disclosure will be described in detail with reference to the accompanying drawings.

These embodiments of the present disclosure to be described below are provided to more clearly explain various embodiments of the present disclosure to those having common knowledge in the related art, and embodiments of the present disclosure are not limited to the following embodiments. The following embodiment may be modified in many different forms.

The terminology used herein is used to describe specific embodiments, and is not used to limit the present disclosure. As used herein, terms in the singular form may include the plural form unless the context clearly dictates otherwise. Also, as used herein, the terms "comprise" and/or "comprising" specifies presence of the stated shape, step, number, action, member, element and/or group thereof; and does not exclude presence or addition of one or more other shapes, steps, numbers, actions, members, elements, and/or groups thereof. Furthermore, the term "connection" as used herein is a concept that includes not only that certain members are directly connected, but also a concept that one or more members are further interposed between the members to be indirectly connected.

Furthermore, in the present specification, when a member is said to be located "on" another member, this includes not only a case in which a member is in contact with another member but also a case in which one or more members are present between the two members. As used herein, the term "and/or" includes any one and any combination of one or more of those listed items. Furthermore, as used herein, terms such as "about", "substantially", etc. are used as a range of the numerical value or degree, in consideration of inherent fabricating and material tolerances, or as a meaning close to the range. Furthermore, accurate or absolute numbers provided to aid the understanding of the present application are used to prevent an infringer from using the disclosed present disclosure unfairly.

Hereinafter, embodiments of the present disclosure will be described in detail with reference to the accompanying drawings. The size or the thickness of the regions or the parts illustrated in the accompanying drawings may be exaggerated for clarity and convenience of description. The same reference numerals may refer to the same elements throughout the detailed description.

FIG. 1A to FIG. 1G are cross-sectional diagrams illustrating a method of forming a contact structure according to an embodiment of the present disclosure.

Referring to FIG. 1A, a porous silicon layer 110 may be formed on a substrate 100 by using an epitaxy process. The substrate 100 may be a semiconductor substrate. For example, the substrate 100 may be a silicon (Si) substrate. In some cases, the substrate 100 may be a silicon germanium (SiGe) substrate or a germanium (Ge) substrate. The substrate 100 may have a single crystal structure. Furthermore, at least a portion of the substrate 100 may be doped with a predetermined impurity (conductive impurity).

The porous silicon layer 110 may be formed on the substrate 100 by using an epitaxy process. The epitaxy process may be performed by using a plasma enhanced chemical vapor deposition (PECVD) method. Accordingly, the epitaxy process may be referred to as a 'plasma epitaxy process'. The porous silicon layer 110 may be formed on the substrate 100 having a crystalline structure, for example, at a process temperature of room temperature to about 300° C. by a PECVD method. The porous silicon layer 110 may have an epitaxial structure. As a result, in an embodiment, the porous silicon layer 110 may have a crystalline structure, for example, a single crystal structure, determined by the crystal structure of the substrate 100. The porosity of the porous silicon layer 110 may be, for example, about 10 to 30 vol %, but the range of the porosity may vary according to embodiments.

In the epitaxy process, $SiH_4$, $Si_2H_6$, $SiCl_4$, $SiHCl_3$, $SiF_4$ and the like may be used as a precursor of silicon (Si). The $SiH_4$, $Si_2H_6$, $SiCl_4$, $SiHCl_3$, $SiF_4$ and the like may be diluted with a reducing or inert gas such as $H_2$, He and the like. Furthermore, when forming the porous silicon layer 110, impurities (dopants) may be included in the porous silicon layer 110, and for example, a gas such as $B_2H_6$, $B(CH_3)_3$, $B(C_2H_5)_3$, $BF_3$, $PH_3$, $AsH_3$, $Al_2(CH_3)_6$, TMGa (trimethylgallium) and etc. may be additionally used in order to include the impurities. The porous silicon layer 110 may be doped with an n-type impurity (dopant) or a p-type impurity (dopant), and the doping concentration of the porous silicon layer 110 may be about $10^{16}$ atoms/$cm^3$ to $10^{20}$ atoms/$cm^3$. Furthermore, if necessary, when forming the porous silicon layer 110, a gas such as $GeH_4$, $CH_4$ and the like may be added to form an alloy or a material similar to the alloy.

When the porous silicon layer 110 is formed, if $SiH_4$ and $H_2$ are used, the dilution ratio of $H_2/SiH_4$ may be adjusted in the range of about 1~100. If the ratio of $SiH_4$ to the total amount of $SiH_4$ and $H_2$ is R, R may be expressed as $[SiH_4/(H_2+SiH_4)]\times100$. According to the R value, the porosity of the porous silicon layer 110 may be adjusted. For example, when the R value decreases within a predetermined range, the porosity of the porous silicon layer 110 may increase. According to an embodiment, the R value (%) may be adjusted within a range of about 0.1 to about 2 as a non-limiting example. On the other hand, when the porous silicon layer 110 is formed, the temperature of the substrate 100 may be adjusted in the range of room temperature to 950° C., preferably, in the range of room temperature to 300° C. When the porous silicon layer 110 is formed at a relatively low temperature ranging from room temperature to 300° C., it may be beneficial to secure porosity and reduce defect density.

Figure 2:
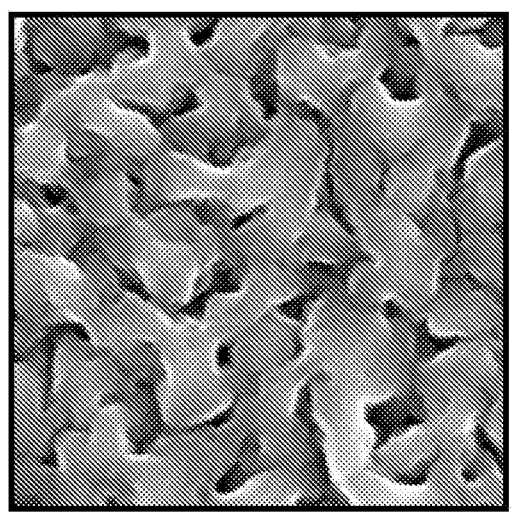
FIG. 2 is a photo image of an electron microscope showing the microstructure of a porous silicon layer formed according to an embodiment of the present disclosure.

FIG. 2 is a photo image of an electron microscope showing the microstructure (a porous structure) of a porous silicon layer (e.g., the porous silicon layer 110 in FIG. 1A) formed according to an embodiment of the present disclosure. As shown in FIG. 2, the porous silicon layer 110 may have a porous structure with a plurality of pores. Here, the size of the pores may be, for example, about 10 nm to about 50 nm, but embodiments of the present embodiment are not limited thereto. It may be mentioned that the porous silicon layer 110 has a nano-porous structure.

Figure 3:
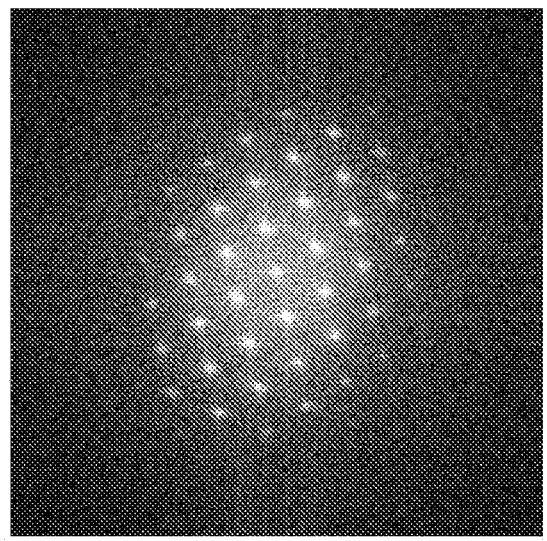
FIG. 3 is an image showing an analysis result of a transmission electron microscope (TEM) of a porous silicon layer formed according to an embodiment of the present disclosure.

FIG. 3 is an image showing an analysis result of a transmission electron microscope (TEM) of a porous silicon layer (e.g., the porous silicon layer 110 of FIG. 1A) formed according to an embodiment of the present disclosure. As shown in FIG. 3, the porous silicon layer 110 in FIG. 1A may have a single crystal epitaxial structure.

Referring back to FIG. 1B, a dielectric layer 120 may be formed on the porous silicon layer 110, and a metal layer 130 may be formed on the dielectric layer 120.

Figure 1B:
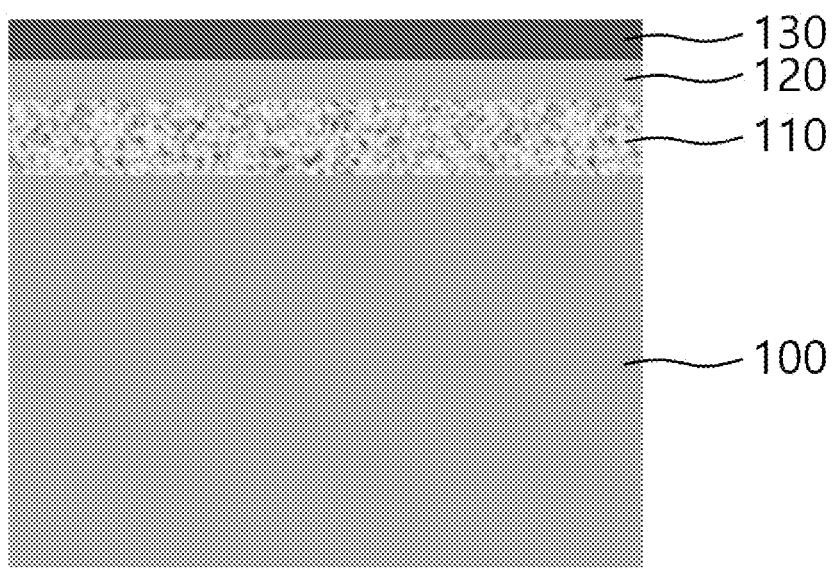

The dielectric layer 120 in FIG. 1B serves to control the degree of diffusion of metal atoms (e.g., metal atoms or particles 10 in FIG. 1C) in the subsequent heat treatment process, and may be referred to as a kind of 'a diffusion control layer (a diffusion adjust layer)'. The dielectric layer 120 may be a thin film (e.g., an ultrathin film) having a considerably thin thickness. For example, the dielectric layer 120 may have a thickness of about 0.1 nm to about 200 nm or a thickness of about 0.1 nm to about 100 nm. If the thickness of the dielectric layer 120 is too thick, diffusion of the metal atoms 10 through the dielectric layer 120 may not be easy, and if the thickness of the dielectric layer 120 is too thin, the function of diffusion control may not be performed properly. Specifically, when the thickness of the dielectric layer 120 is greater than 200 nm, the number of the metal atoms diffusing through the dielectric layer 120 to reach the porous silicon layer 110 to form nuclei for silicide formation may be insufficient to reach target density of the nuclei. When the thickness of the dielectric layer 120 is less than 0.1 nm, the dielectric layer 120 may not properly serve as a diffusion control layer.

The dielectric layer 120 may be formed to include one or more of various dielectric (insulator) materials, such as silicon oxide ($SiO_2$), silicon nitride ($Si_3N_4$), silicon oxynitride ($SiO_xN_y$), aluminum oxide ($Al_2O_3$) (e.g., sapphire), hafnium oxide ($HfO_2$), zirconium oxide ($ZrO_2$), or the like. The dielectric layer 120 may be formed through one or more of various vapor deposition methods, such as thermal evaporation, sputtering, chemical vapor deposition (CVD), plasma-enhanced chemical vapor deposition (PECVD), atomic layer deposition (ALD), pulse-laser deposition (PLD), and molecular beam epitaxy (MBE) method.

Additionally, the dielectric layer 120 may have a porosity of less than about 20 vol %, or preferably less than 5 vol %. When these conditions are satisfied, the diffusion control function of metal atoms (e.g., the metal atoms 10 in FIG. 1C) using the dielectric layer 120 may be improved. For example, when the dielectric layer 120 has a porosity greater than about 20 vol %, diffusion of metal atoms through the dielectric layer 120 may be excessive such that the dielectric layer 120 does not properly serve as a diffusion control layer.

For example, the metal layer 130 may be formed to include one or more of tungsten (W), titanium (Ti), tantalum (Ta), platinum (Pt), nickel (Ni), cobalt (Co), and molybdenum (Mo). The metal layer 130 may be formed by thermal evaporation, sputtering, chemical vapor deposition (CVD), or the like. The thickness of the metal layer 130 may be, for example, about 0.1 nm to about 50 nm. When this thickness range is satisfied, the metal ions (e.g., the metal ions 10 in FIG. 1C) of the metal layer 130 may be more appropriately diffused in a subsequent heat treatment process.

Figure 1C:
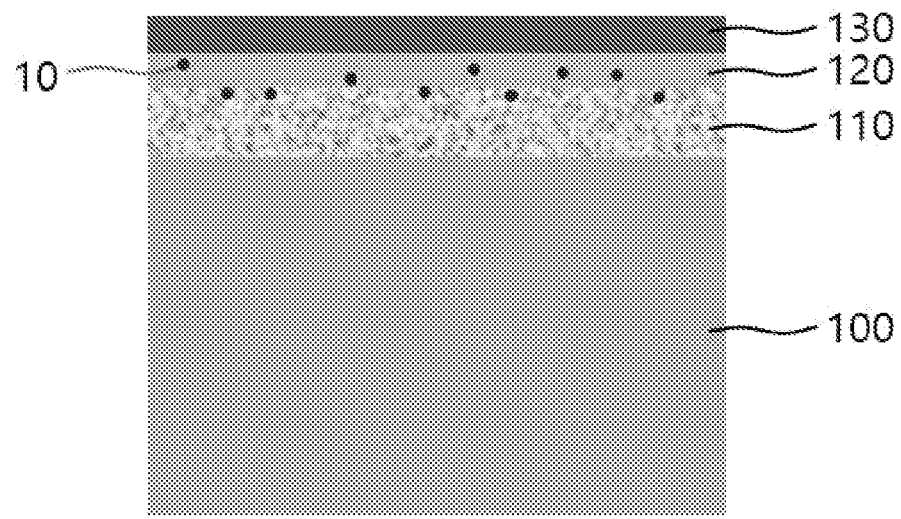

Referring to FIG. 1C, the metal atoms (metal particles) 10 of the metal layer 130 may be diffused into the porous silicon layer 110 through the dielectric layer 120 by performing a heat treatment process for the porous silicon layer 110, the dielectric layer 120, and the metal layer 130. The heat treatment process may be performed, for example, at a temperature of about 300° C. to about 950° C. For example, when the temperature of the heat treatment process is lower than 300° C., the number of the metal atoms diffusing through the dielectric layer 120 to reach the porous silicon layer 110 to form nuclei for silicide formation may be insufficient to reach a minimum target value of nuclei density. When the temperature of the heat treatment process is higher than 950° C., the number of the metal atoms diffusing through the dielectric layer 120 to reach the porous silicon layer 110 may be excessively large to exceed a maximum target value of nuclei density. Furthermore, during the heat treatment process, a temperature profiling method that changes temperature with time may be applied.

The dielectric layer 120 may serve to control the degree of diffusion of the metal atoms 10 in the heat treatment process. The metal atoms 10 may reach the porous silicon layer 110 to form a nucleus (a kind of seed) for silicide (i.e., metal silicide) formation, and the density of the formed nuclei may be adjusted by the dielectric layer 120. In an embodiment, the density of the nuclei may be adjusted according to one or more of a thickness of the dielectric layer 120, a porosity of the dielectric layer 120, a material of the dielectric layer 120, a material of the metal layer 130, and a temperature of the heat treatment process. Specifically, the density of the nucleus may be adjusted according to the thickness and material of the dielectric layer 120. For example, the density of the nuclei may be easily controlled by adjusting the thickness of the dielectric layer 120. A silicide member (e.g., a silicide member 140 in FIG. 1D) having a three-dimensional structure may be more easily formed in the porous silicon layer 110 by appropriately controlling (i.e., reducing) the formation density of the nucleus using the dielectric layer 120. A result of the heat treatment process of FIG. 1C may be the same as that of FIG. 1D.

Figure 1D:
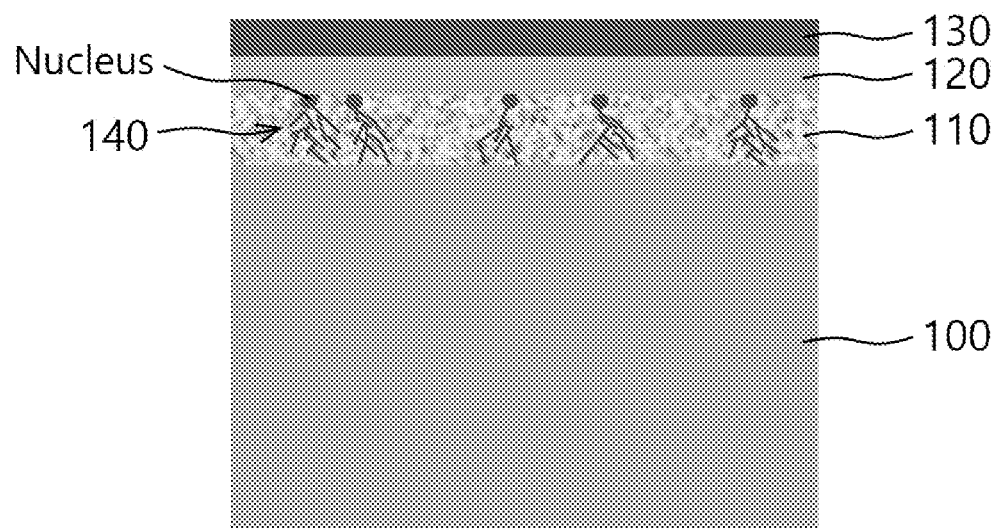

Referring to FIG. 1D, in the heat treatment process, the metal atoms 10 in FIG. 1C of the metal layer 130 may diffuse into the porous silicon layer 110 through the dielectric layer 120 to form nuclei for silicide formation, and a silicide may grow from the nucleus. Accordingly, the metal atoms 10 may react with the porous silicon layer 110 to form silicide. As a result, the silicide member 140 having a three-dimensional structure may be formed in the pores of the porous silicon layer 110. The silicide member 140 may be formed in a pore, around a pore, or along a pore structure of the porous silicon layer 110. A plurality of silicide members 140 may be grown from a plurality of nuclei.

The silicide member 140 may be formed while growing in a downward direction from an upper portion (e.g., an upper surface) of the porous silicon layer 110. A lower end of the silicide member 140 may contact an upper surface of the substrate 100. The silicide member 140 may have a dendrite structure. The silicide member 140 may have a dendrite-shaped network structure. Accordingly, the silicide member 140 may have a very large surface area on a two-dimensional plane with a small size.

According to an embodiment, the processes of FIGS. 1A to 1D may be performed in a single reactor. That is, the formation of the porous silicon layer 110, the formation of the dielectric layer 120, the formation of the metal layer 130, and the heat treatment process thereon may be performed in the same reactor (chamber). Accordingly, the process may be easily performed.

Figure 1E:
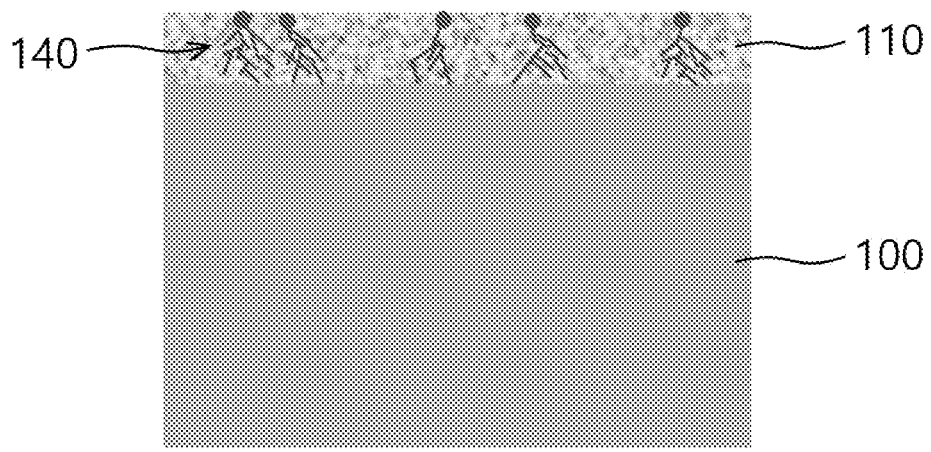

Referring to FIG. 1E, after the silicide member 140 is formed in FIG. 1D, the metal layer 130 and the dielectric layer 120 may be removed. The metal layer 130 and the dielectric layer 120 may be removed using a general etching process.

Figure 1F:
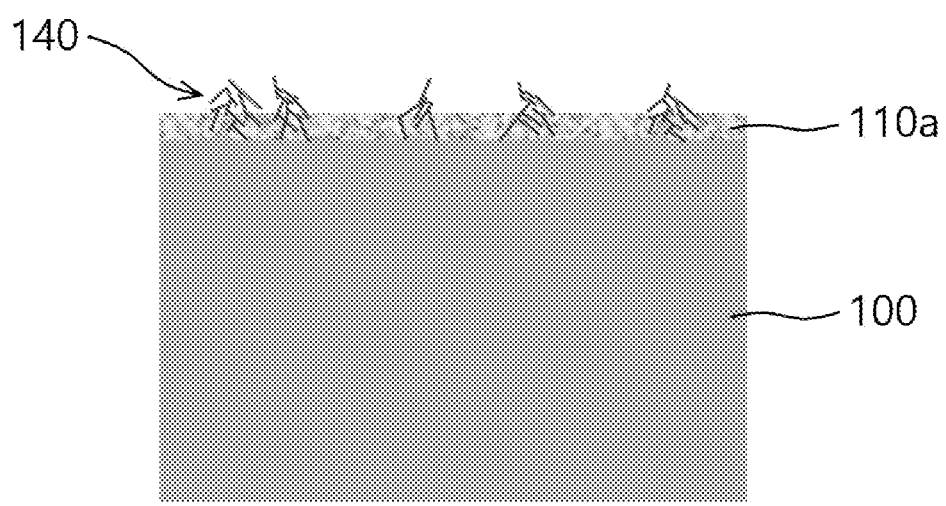

Referring to FIG. 1F, at least a portion of the porous silicon layer 110 of FIG. 1E may be etched to at least partially expose the three-dimensional structure of the silicide member 140. Since the silicide member 140 and the porous silicon layer 110 may have a relatively large etch selectivity, at least a portion of the porous silicon layer 110 may be selectively etched. A method such as plasma etching or wet etching may be used to etch the porous silicon layer 110. The reference numeral 110a denotes the porous silicon layer remaining after etching. In some cases, the entire porous silicon layer 110 may be removed by etching. However, it may be desirable to leave a portion 110a of the porous silicon layer 110 in order to improve contact characteristics and secure a contact area.

Figure 1G:
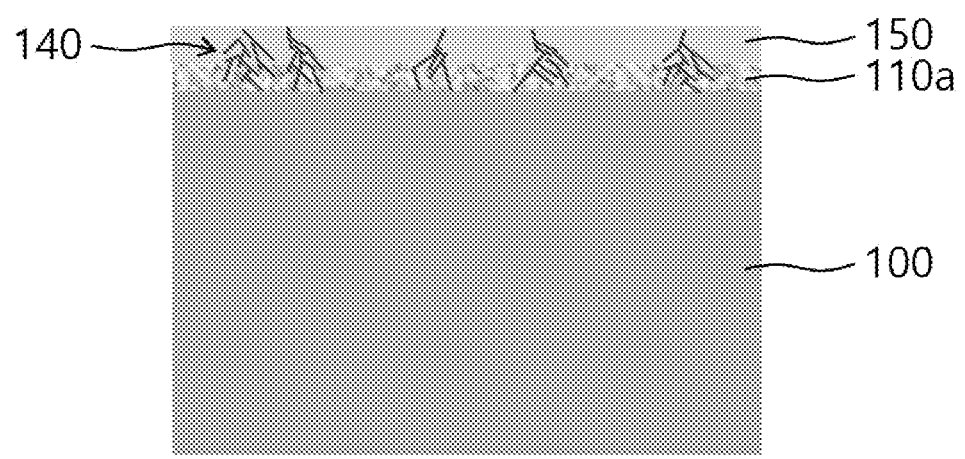

Referring to FIG. 1G, a conductive layer (e.g., metallic conductive layer) 150 in contact with the silicide member 140 may be formed. The metallic conductive layer 150 may be formed to contact the three-dimensional structure of the exposed silicide member 140 in a three-dimensional manner. At least a portion of the silicide member 140 may be embedded in the metallic conductive layer 150. Furthermore, a portion of the silicide member 140 may be embedded in the porous silicon layer 110a. In the embodiment of FIG. 1G, a lower portion of the silicide member 140 may be embedded in the porous silicon layer 110a, and an upper portion of the silicide member 140 may be embedded in the metallic conductive layer 150. The silicide member 140 having the three-dimensional structure may contact the porous silicon layer 110a with a large effective contact area, and may also contact the metallic conductive layer 150 with a large effective contact area. Accordingly, the contact resistance between the porous silicon layer 110a and the metallic conductive layer 150 may be greatly reduced by the silicide member 140 having the three-dimensional structure, and excellent contact characteristics may be secured. In other words, excellent contact characteristics between the semiconductor and the metal (or metal compound) may be secured by the silicide member 140.

The metallic conductive layer 150 may include a metal, or a metal compound, or both. The metallic conductive layer 150 may be a metal electrode or a metal compound electrode. As a material of the metallic conductive layer 150, any electrode material of a general semiconductor device may be applied.

FIG. 4A to FIG. 4D are cross-sectional diagrams illustrating a method of forming a contact structure according to another embodiment of the present disclosure.

Figure 4A:
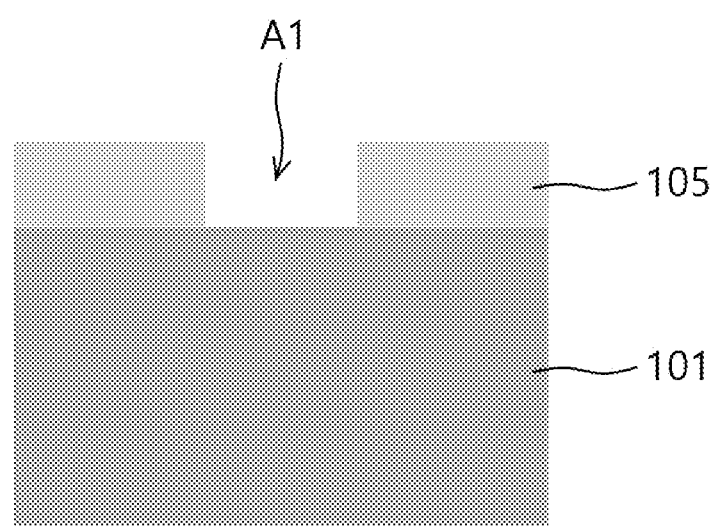
FIGS. 4A, 4B, 4C, and 4D are cross-sectional diagrams illustrating a method of forming a contact structure according to another embodiment of the present disclosure.

Referring to FIG. 4A, a mask layer 105 having an opening A1 that exposes a first region of the substrate 101 may be formed on the substrate 101. The substrate 101 may be the same as the substrate 100 described with reference to FIG. 1A. According to the embodiment of FIG. 4A, at least the first region of the substrate 101 may have a crystal plane in the (100) direction. The substrate 101 may be a crystalline (single crystal) substrate preferentially oriented in the (100) direction. Also, the first region may correspond to a well region or a doped region formed in the substrate 101.

The mask layer 105 may be an insulating layer (e.g., a dielectric layer). The mask layer 105 may be formed to include one or more of silicon oxide ($SiO_2$), silicon nitride ($Si_3N_4$), silicon oxynitride ($SiO_xN_y$), and other various insulator (dielectric) materials. The mask layer 105 may have an amorphous structure.

Figure 4B:
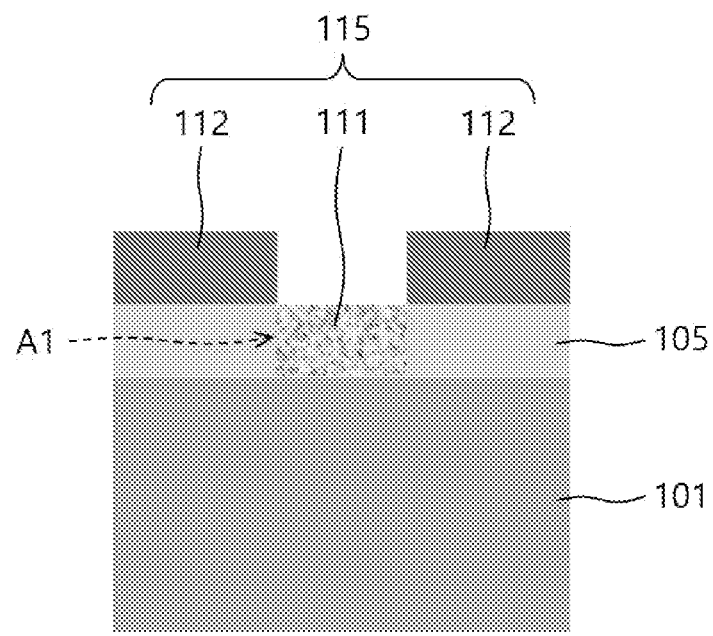

Referring to FIG. 4B, a silicon material layer 115 may be formed on the first region of the substrate 101 and the mask layer 105. The process for forming the silicon material layer 115 may be substantially the same as or similar to the process of forming the porous silicon layer 110 on the substrate 100 in FIG. 1A. In an embodiment, the silicon material layer 115 may be formed by epitaxial growth of silicon on the substrate 101 and the mask layer 105. For example, the silicon material layer 115 may be formed by a PECVD method.

The silicon material layer 115 may include a first silicon layer 111 formed on the first region and a second silicon layer 112 formed on the mask layer 105. The first silicon layer 111 may have a crystalline structure, and the second silicon layer 112 may have an amorphous structure. The first silicon layer 111 having a single crystal epitaxial structure may be formed on the first region having a crystal plane in the (100) direction, and the second silicon layer 112 having an amorphous structure may be formed on the mask layer 105 having an amorphous structure. Here, the first silicon layer 111 formed on the first region may correspond to the porous silicon layer 110 described in FIG. 1A and so on. Accordingly, the first silicon layer 111 may be referred to as a 'porous silicon layer'.

Since the first silicon layer 111 and the second silicon layer 112 have a relatively large etching selectivity, the second silicon layer 112 of the first silicon layer 111 and the second silicon layer 112 may be selectively and easily etched and removed by using a predetermined etching method. For example, plasma etching, reactive ion etching (RIE), wet etching, or the like may be used for etching of the second silicon layer 112 by using the etching selectivity. Here, when the plasma etching or RIE etching is used, hydrogen plasma or various fluorine-based etching gases may be used. In particular, when the hydrogen plasma is used, the second silicon layer 112 may be easily and selectively removed.

Figure 4C:
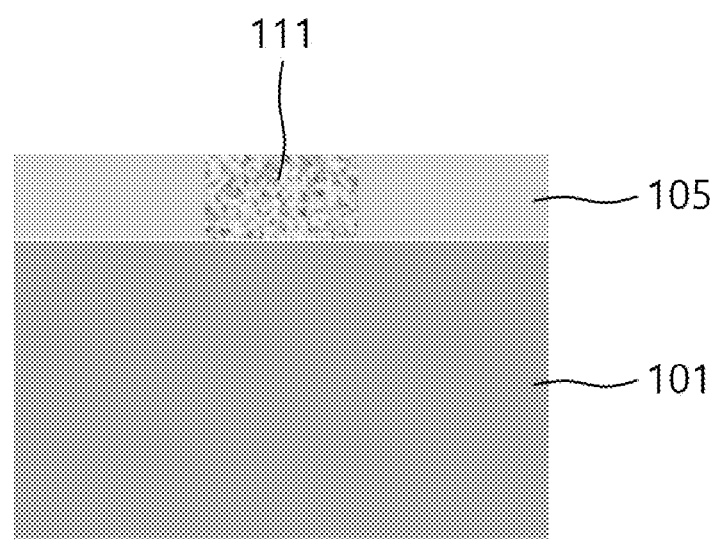

A resulting structure obtained by selectively removing the second silicon layer 112 in FIG. 4B is shown in FIG. 4C. Referring to FIG. 4C, the first silicon layer 111, that is, a porous silicon layer may be disposed on the first region of the substrate 101. Hereinafter, the first silicon layer 111 is referred to as a 'porous silicon layer 111'.

As described with reference to FIGS. 4A to 4C, according to an embodiment of the present disclosure, the porous silicon layer 111 may be easily formed on the first region of the substrate 101 by using a self-aligning technique and a selective etching technique based on an etch selectivity ratio. Therefore, it is possible to easily form the porous silicon layer 111 in a desired region of the substrate 101 by a relatively simple method.

Figure 4D:
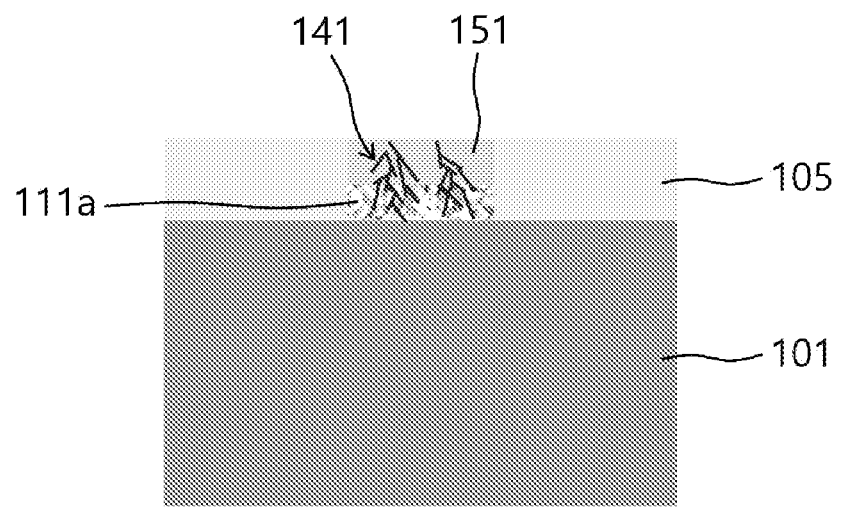

Next, with respect to the porous silicon layer 111 of FIG. 4C, by applying the method described with reference to FIGS. 1B to 1G, a silicide member 141 having a three-dimensional structure and a conductive layer (e.g., metallic conductive layer) 151 in contact with the silicide member 141 may be formed as shown in FIG. 4D. In FIG. 4D, a reference numeral 111a denotes a remaining porous silicon layer. The structure of FIG. 4D may be easily understood from the structure of FIG. 1G.

Figure 5:
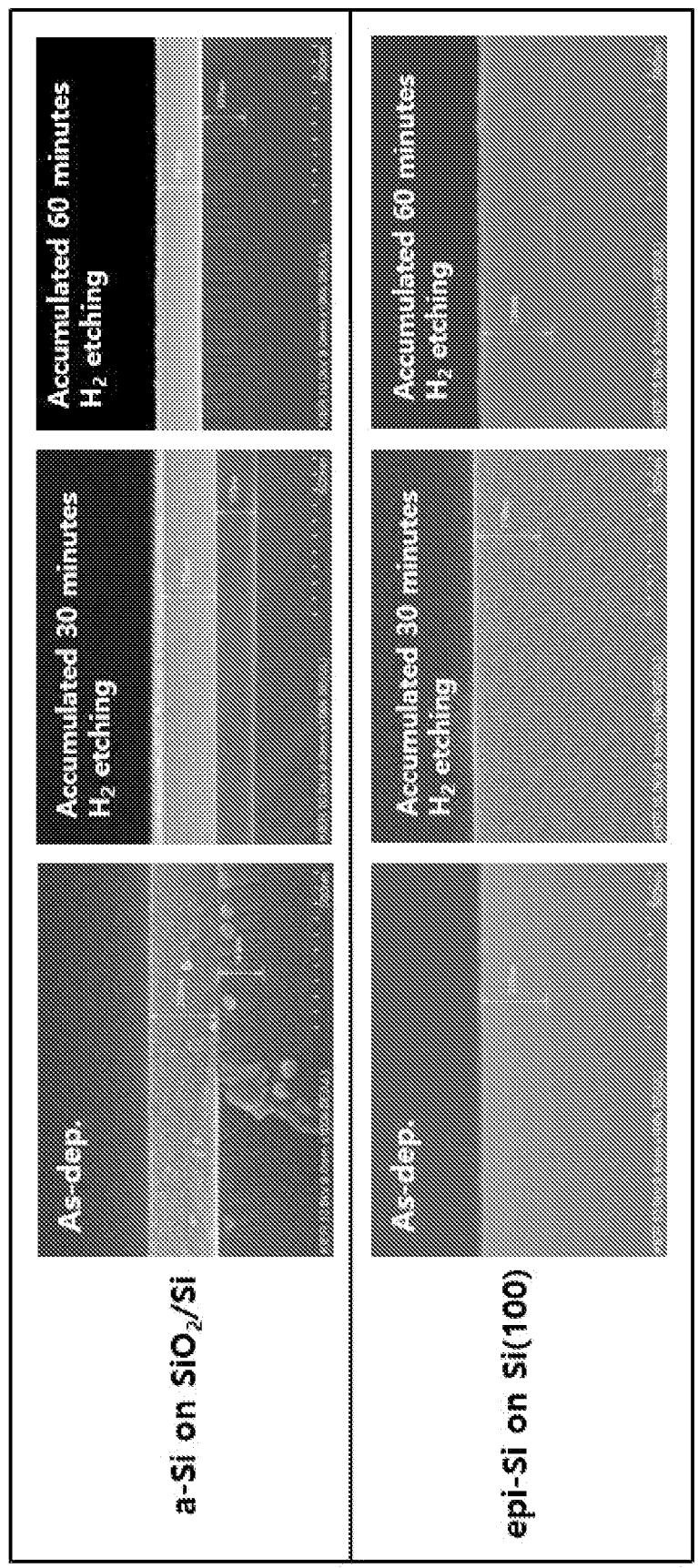
FIG. 5 is a photo image of an electron microscope showing the result obtained by observing the change in layer thickness with an etching time by using hydrogen plasma for each of an amorphous Si layer (i.e., a-Si layer) formed on a $SiO_2$/Si substrate and an epitaxial Si layer (i.e., epi-Si layer) formed on a Si(100) substrate.

FIG. 5 is a photo image of an electron microscope showing the result obtained by observing the change in layer thickness with an etching time by using hydrogen plasma for each of an amorphous Si layer (i.e., a-Si layer) formed on a SiO$_2$/Si substrate and an epitaxial Si layer (i.e., epi-Si layer) formed on a Si(100) substrate. Here, the SiO$_2$/Si is a structure in which an SiO$_2$ insulating layer is formed on a Si substrate, and the SiO$_2$ insulating layer may correspond to the mask layer 105 of FIG. 4B. Also, the Si(100) substrate may correspond to a region (e.g., the first region) of the substrate 101 exposed by the opening A1 of the mask layer 105 in FIG. 4B. The epi-Si layer may correspond to the first silicon layer (e.g., the porous silicon layer) 111 of FIG. 4B, and the a-Si layer may correspond to the second silicon layer 112 (e.g., the amorphous silicon layer) of FIG. 4B.

Referring to FIG. 5, in the case of the a-Si layer, it may be seen that the thickness of the layer continuously decreases as the etching time of hydrogen plasma elapses. On the other hand, in the case of the epi-Si layer, it may be seen that the change in the thickness of the layer is remarkably small even when the etching time of the hydrogen plasma elapses. This indicates that the etching selectivity of the a-Si layer and the epi-Si layer is quite large.

Figure 6:
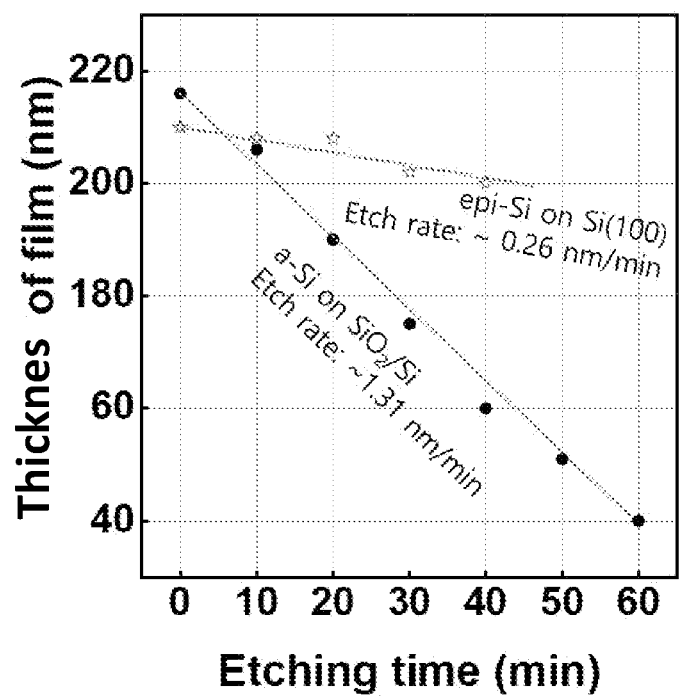
FIG. 6 is a graph showing the change in layer thickness with respect to the lapse of an etching time of hydrogen plasma on the a-Si layer and the epi-Si layer described in FIG. 5.

FIG. 6 is a graph showing the change in layer thickness with respect to the lapse of an etching time of hydrogen plasma on the a-Si layer and the epi-Si layer described in FIG. 5.

Referring to FIG. 6, it may be confirmed that in the case of the a-Si layer, the thickness change of the layer with respect to the lapse of etching time occurs with a relatively large slope, but in the case of the epi-Si layer, the change in the thickness of the layer with respect to the lapse of the etching time occurs with a relatively a small slope. The etching selectivity of the a-Si layer and the epi-Si layer with respect to the etching using the hydrogen plasma may be about 5:1 or more. Therefore, as described in FIGS. 4B and 4C, the second silicon layer (e.g., the amorphous silicon layer) 112 may be selectively removed using an etching process.

The method of forming the contact structure according to the embodiments described with reference to FIGS. 1A to 1G and 4A to 4D may be applied to fabricating various semiconductor devices. A method of fabricating a semiconductor device according to an embodiment of the present disclosure is a method of fabricating a semiconductor device including a contact structure, and may include forming a contact structure by using at least some of the methods described with reference to FIGS. 1A to 1G and 4A to 4D. For example, the contact structure may be applied to a source/drain of a transistor, and may be applied to various components of various devices. The contact structure according to these embodiments may be applied to a portion requiring a low resistance contact between a semiconductor and a metallic conductor.

Figure 7:
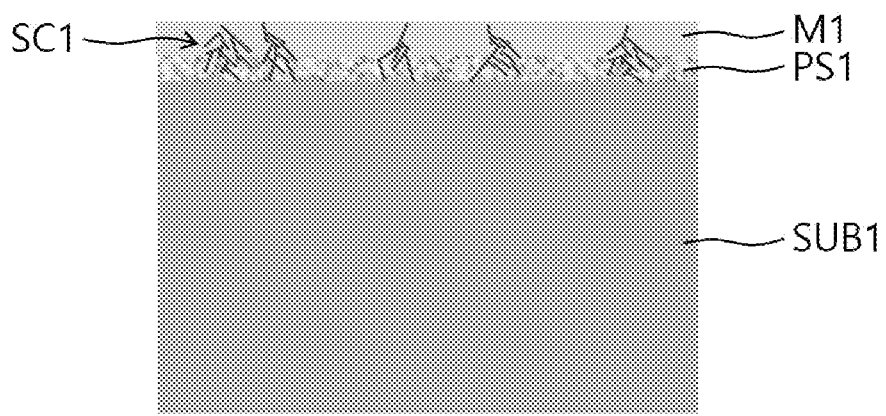
FIG. 7 is a cross-sectional diagram illustrating a contact structure of a semiconductor device according to an embodiment of the present disclosure.

FIG. 7 is a cross-sectional diagram illustrating a contact structure of a semiconductor device according to an embodiment of the present disclosure.

Referring to FIG. 7, the contact structure of the semiconductor device may include a substrate SUB1 and a silicide member SC1 having a three-dimensional structure disposed on the substrate SUB1. The silicide member SC1 may have, for example, a dendrite structure. The contact structure may include a conductive layer (e.g., metallic conductive layer) M1 disposed on the substrate SUB1 to contact the silicide member SC1. The metallic conductive layer M1 may three-dimensionally contact the three-dimensional structure of the silicide member SC1 by embedding at least a portion of the silicide member SC1 therein.

Furthermore, the contact structure may further include a porous silicon layer PS1 having an epitaxial structure between the substrate SUB1 and the metallic conductive layer M1. In this case, a lower portion of the silicide member SC1 may be embedded in the porous silicon layer PS1, and an upper portion of the silicide member SC1 may be embedded in the metallic conductive layer M1. The porous silicon layer PS1 may be in direct contact with the metallic conductive layer M1. The porous silicon layer PS1 may have, for example, a porosity of about 10 to about 30 vol %, but the range of the porosity may vary. Meanwhile, an upper portion of the substrate SUB1 may have a crystal plane in the (100) direction.

The contact structure of FIG. 7 may be the same as the contact structure described with reference to FIG. 1G. Accordingly, details of the contact structure of FIG. 7 may be easily understood from FIG. 1G. Also, the contact structure of FIG. 7 may be changed according to the above-described modification method.

Figure 8:
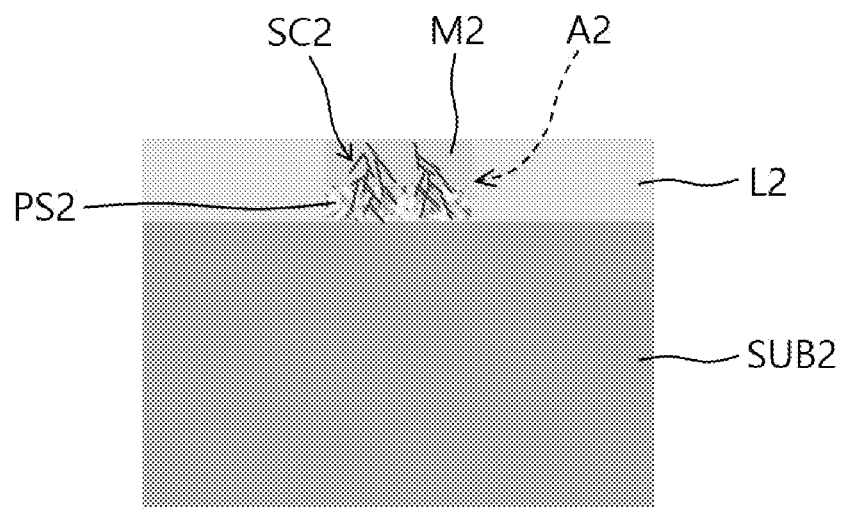
FIG. 8 is a cross-sectional diagram illustrating a contact structure of a semiconductor device according to another embodiment of the present disclosure.

FIG. 8 is a cross-sectional diagram illustrating a contact structure of a semiconductor device according to another embodiment of the present disclosure.

Referring to FIG. 8, the contact structure of the semiconductor device may include a substrate SUB2 and a silicide member SC2 having a three-dimensional structure disposed on the substrate SUB2. The contact structure may include a conductive layer (e.g., metallic conductive layer) M2 disposed on the substrate SUB2 to contact the silicide member SC2. The metallic conductive layer M2 may three-dimensionally contact the three-dimensional structure of the silicide member SC2 by embedding at least a portion of the silicide member SC2 therein. Furthermore, the contact structure may further include a porous silicon layer PS2 having an epitaxial structure between the substrate SUB2 and the metallic conductive layer M2. A lower portion of the silicide member SC2 may be embedded in the porous silicon layer PS2, and an upper portion of the silicide member SC2 may be embedded in the metallic conductive layer M2. An upper surface of the substrate SUB2 may have a crystal plane in the (100) direction.

According to this embodiment, a mask layer L2 having an opening A2 exposing a first region of the substrate SUB2 may be disposed on the substrate SUB2, and the porous silicon layer PS2, the silicide member SC2, and the metallic conductive layer M2 may be disposed on the first region.

The contact structure of FIG. 8 may be the same as the contact structure described with reference to FIG. 4D. Accordingly, details of the contact structure of FIG. 8 may be easily understood from FIG. 4D. Also, the contact structure of FIG. 8 may be changed according to the above-described modification method.

At least a portion of the contact structure according to the embodiments described with reference to FIGS. 7 and 8 may be applied to various semiconductor devices. A semiconductor device according to an embodiment of the present disclosure is a semiconductor device including a contact structure, and may include at least a portion of the contact structure according to the embodiments described with reference to FIGS. 7 and 8. For example, the contact structure may be applied to a source/drain of a transistor, and may be applied to various components of various devices. The contact structure according to such embodiments may be applied to a portion requiring a low resistance contact between a semiconductor and a metallic conductor.

Figure 9:
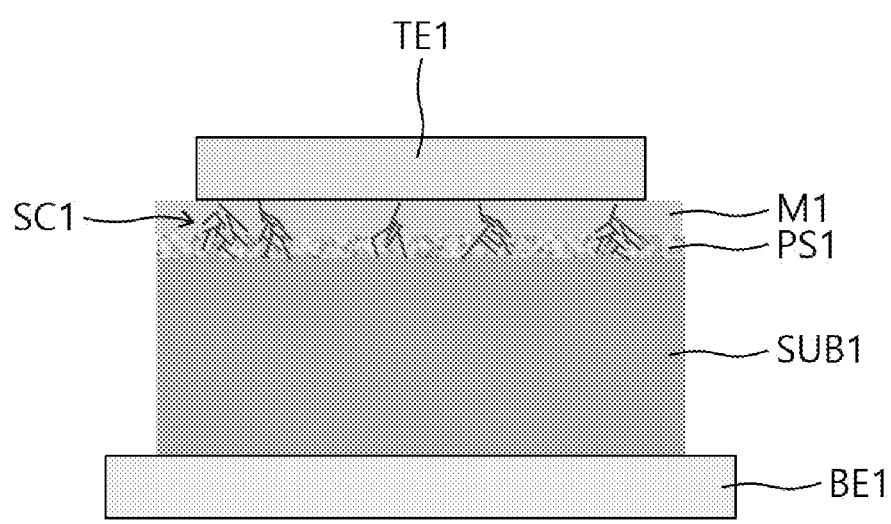
FIG. 9 is a cross-sectional diagram illustrating a semiconductor device including a contact structure according to an embodiment of the present disclosure.

FIG. 9 is a cross-sectional diagram illustrating a semiconductor device including a contact structure according to an embodiment of the present disclosure.

Referring to FIG. 9, a semiconductor device according to an embodiment may include a substrate SUB1, a silicide member SC1 having a three-dimensional structure, a porous silicon layer PS1, and a conductive layer (e.g., metallic conductive layer) M1. Since each of the substrate SUB1, the silicide member SC1, the porous silicon layer PS1, and the metallic conductive layer M1 may be the same as described in FIG. 7, a repeated description thereof will be omitted.

The semiconductor device may further include a first electrode member BE1 disposed on a lower surface of the substrate SUB1. For example, the first electrode member BE1 may be in contact with the lower surface of the substrate SUB1. Furthermore, the semiconductor device may further include a second electrode member TE1 disposed on an upper surface of the metallic conductive layer M1. For example, the second electrode member TE1 may be in contact with the upper surface of the metallic conductive layer M1. The semiconductor device may be a two-terminal type device. Although not shown, a base member supporting the first electrode member BE1 may be further provided on a lower surface of the first electrode member BE1.

However, the structure of the semiconductor device shown in FIG. 9 is only an example, and the structure of the semiconductor device to which the contact structure according to embodiments of the present disclosure is applied may be variously changed. For example, the contact structure may be applied to source/drain contacts of a transistor, and may be applied to semiconductor devices having various other structures.

According to the embodiments of the present disclosure described above, a method of forming a contact structure capable of overcoming limitations and problems of the conventional method and reducing the contact resistance of a semiconductor device and a method of fabricating a semiconductor device using the same may be implemented. Furthermore, according to embodiments of the present disclosure, a contact structure capable of securing low contact resistance and excellent contact characteristics even in a small area and a semiconductor device including the same may be implemented. In particular, according to embodiments of the present disclosure, a contact resistance may be greatly reduced and contact characteristics may be greatly improved through three-dimensional contact between a semiconductor and a conductor (e.g., a metallic conductor). For example, the three-dimensional contact between a semiconductor and a metallic conductor may be implemented using a silicide member having a three-dimensional network structure with a relatively large surface area to couple the semiconductor and the metallic conductor, thereby reducing the contact resistance and improving contact characteristics between the semiconductor and the metallic conductor compared to a conventional contact structure. Furthermore, according to embodiments of the present disclosure, since a contact formation region may be easily defined by using a self-aligning technique, fabricating a semiconductor device may be facilitated. These embodiments of the present disclosure may be usefully applied to high-integration and high-performance semiconductor devices.

In the present specification, some embodiments of the present disclosure have been disclosed, and although specific terms are used, these are only used in a general sense to easily describe the technical contents of the present disclosure and to help the understanding of the present disclosure, and are not used to limit the scope of the present disclosure. It will be apparent to those of ordinary skill in the art to which the present disclosure pertains that other modifications may be implemented. It will be appreciated to those of ordinary skill in the art that a method of forming a contact structure, a method of fabricating a semiconductor device, a contact structure and a semiconductor device including the same according to the embodiments described with reference to FIGS. 1A to 9 may be variously substituted, changed, and modified. Therefore, the scope of the disclosure should not be determined by the described embodiments, but should be determined by the technical concepts described in the claims.

EXPLANATION OF SYMBOLS

*Explanation of Symbols for the Main Parts of the Drawing*

| | |
|---|---|
| 100, 101: substrate | 105: mask layer |
| 110, 110a: porous silicon layer | 111: first silicon layer |
| 112: second silicon layer | 115: silicon material layer |
| 120: dielectric layer | 130: metal layer |
| 140, 141: silicide member | 150, 151: metallic conductive layer |
| A1, A2: opening | L2: mask layer |
| M1, M2: metallic conductive layer | PS1, PS2: porous silicon layer |
| SC1, SC2: silicide member | SUB1, SUB2: substrate |

What is claimed is:

1. A method of forming a contact structure, comprising:
   forming a porous silicon layer on a substrate by using an epitaxy process;
   forming a dielectric layer on the porous silicon layer;
   forming a metal layer on the dielectric layer;
   forming a silicide member having a three-dimensional structure in the porous silicon layer by diffusing metal atoms of the metal layer into the porous silicon layer through the dielectric layer and reacting the diffused metal atoms with the porous silicon layer in a heat treatment process;
   removing the metal layer and the dielectric layer;
   etching at least a portion of the porous silicon layer to at least partially expose the three-dimensional structure of the silicide member after removing the metal layer and the dielectric layer; and
   forming a conductive layer in contact with the silicide member, wherein the conductive layer is formed to three-dimensionally contact the three-dimensional structure of the exposed silicide member.

2. The method of claim 1, wherein the porous silicon layer has a porosity of about 10 to about 30 vol %.

3. The method of claim 1, wherein the porous silicon layer is formed by a plasma enhanced chemical vapor deposition (PECVD) method at a process temperature of room temperature to about 300° C.

4. The method of claim 1, wherein the dielectric layer has a porosity of less than 5 vol %.

5. The method of claim 1, wherein the dielectric layer has a thickness of about 0.1 nm to about 200 nm.

6. The method of claim 1, wherein the dielectric layer includes one or more of silicon oxide, silicon nitride, silicon oxynitride, aluminum oxide, hafnium oxide, and zirconium oxide.

7. The method of claim 1, wherein the metal layer includes one or more of tungsten (W), titanium (Ti), tantalum (Ta), platinum (Pt), nickel (Ni), cobalt (Co), and molybdenum (Mo).

8. The method of claim 1, wherein the heat treatment process is performed at a temperature of about 300° C. to about 950° C.

9. The method of claim 1, wherein the silicide member has a dendrite structure.

10. The method of claim 1, wherein forming the porous silicon layer includes:
    forming a mask layer having an opening on the substrate, the opening exposing a first region of the substrate;
    forming a silicon material layer on the first region and the mask layer, wherein the silicon material layer includes a first silicon layer formed on the first region and a second silicon layer formed on the mask layer, and wherein the first silicon layer has a crystalline structure and the second silicon layer has an amorphous structure; and
    removing the second silicon layer, and
    wherein the first silicon layer formed on the first region corresponds to the porous silicon layer.

11. The method of claim 10, wherein the first region of the substrate has a crystal plane in a (100) direction.

12. The method of claim 10, wherein the mask layer is an insulating layer.

13. The method of claim 10, wherein the second silicon layer is removed by an etching process using hydrogen plasma.

14. A method of fabricating a semiconductor device comprising a contact structure, the method comprising: forming the contact structure by using the method according to claim 1.

15. A contact structure of a semiconductor device, comprising:
    a substrate;
    a silicide member disposed on the substrate and having a three-dimensional structure; and
    a conductive layer disposed on the substrate to be in contact with the silicide member and disposed to three-dimensionally contact the three-dimensional structure of the silicide member by embedding at least a portion of the silicide member therein; and
    a porous silicon layer which is disposed between the substrate and the conductive layer, and has an epitaxial structure,
    wherein a lower portion of the silicide member is embedded in the porous silicon layer, and an upper portion of the silicide member is embedded in the conductive layer.

16. The contact structure of a semiconductor device of claim 15, wherein the silicide member has a dendrite structure.

17. The contact structure of a semiconductor device of claim 15, wherein the porous silicon layer has a porosity of about 10 to about 30 vol %.

18. The contact structure of a semiconductor device of claim 15, wherein an upper portion of the substrate has a crystal plane in a (100) direction.

19. A semiconductor device comprising the contact structure according to claim 15.

* * * * *